United States Patent
Katsumata et al.

(10) Patent No.: US 8,405,142 B2
(45) Date of Patent: Mar. 26, 2013

(54) SEMICONDUCTOR MEMORY DEVICE

(75) Inventors: Ryota Katsumata, Mie-ken (JP); Kazuyuki Higashi, Kanagawa-ken (JP); Yoshiaki Fukuzumi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 13/043,714

(22) Filed: Mar. 9, 2011

(65) Prior Publication Data

US 2012/0068252 A1    Mar. 22, 2012

(30) Foreign Application Priority Data

Sep. 22, 2010   (JP) ................................ 2010-212858

(51) Int. Cl.
*H01L 29/792*   (2006.01)

(52) U.S. Cl. ........ 257/324; 257/314; 257/325; 257/326; 257/E29.309

(58) Field of Classification Search .................. 257/314, 257/324, 325, 326, E29.309
See application file for complete search history.

(56) References Cited

U.S. PATENT DOCUMENTS

| | | | |
|---|---|---|---|
| 2009/0267128 A1 | 10/2009 | Maejima | |
| 2009/0267139 A1 | 10/2009 | Maejima | |
| 2010/0207186 A1 | 8/2010 | Higashi et al. | |
| 2011/0147818 A1* | 6/2011 | Katsumata et al. | 257/314 |

OTHER PUBLICATIONS

Japanese Office Action issued on Jan. 21, 2013 in counterpart Japanese Patent Application No. 2010-212858 and Partial English Translation.

* cited by examiner

*Primary Examiner* — Andy Huynh

(74) *Attorney, Agent, or Firm* — Oblon, Spivak, McClelland, Maier & Neustadt, L.L.P.

(57) ABSTRACT

According to one embodiment, a semiconductor memory device includes a substrate, a multilayer body, a semiconductor member and a charge storage layer. The multilayer body is provided on the substrate, with a plurality of insulating films and electrode films alternately stacked, and includes a first staircase and a second staircase opposed to each other. The semiconductor member is provided in the multilayer body outside a region provided with the first staircase and the second staircase, and the semiconductor member extends in stacking direction of the insulating films and the electrode films. The charge storage layer is provided between each of the electrode films and the semiconductor member. The each of the electrode films includes a first terrace formed in the first staircase, a second terrace formed in the second staircase and a bridge portion connecting the first terrace and the second terrace.

7 Claims, 8 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2010-212858, filed on Sep. 22, 2010; the entire contents of which are incorporated herein by reference.

FIELD

Embodiments described herein relate generally to a semiconductor memory device.

BACKGROUND

A collectively processed multilayer memory is proposed as a way to increase the capacity and reduce the cost of a semiconductor memory device. In a collectively processed multilayer memory, insulating films and electrode films are alternately stacked on a semiconductor substrate to form a multilayer body. Then, through holes are formed in the multilayer body by lithography. A block layer, a charge storage layer, and a tunnel layer are deposited in this order in the through hole. Furthermore, a silicon pillar is buried in the through hole. Thus, the multilayer memory is manufactured. In such a multilayer memory, a memory transistor is formed at the intersection of the electrode film and the silicon pillar and serves as a memory cell. Furthermore, besides the memory region including the multilayer body, a peripheral circuit region is provided. In the peripheral circuit region, a driver circuit for driving the memory cells is formed. The end portion of the multilayer body is shaped like a staircase in which a terrace is formed for each electrode film. A contact is connected to each electrode film.

DETAILED DESCRIPTION

In general, according to one embodiment, a semiconductor memory device includes a substrate, a multilayer body, a semiconductor member and a charge storage layer. The multilayer body is provided on the substrate, with a plurality of insulating films and electrode films alternately stacked, and includes a first staircase and a second staircase opposed to each other. The semiconductor member is provided in the multilayer body outside a region provided with the first staircase and the second staircase, and the semiconductor member extends in stacking direction of the insulating films and the electrode films. The charge storage layer is provided between each of the electrode films and the semiconductor member. The each of the electrode films includes a first terrace formed in the first staircase, a second terrace formed in the second staircase and a bridge portion connecting the first terrace and the second terrace.

An embodiment of the invention will now be described with reference to the drawings.

Figure 1:
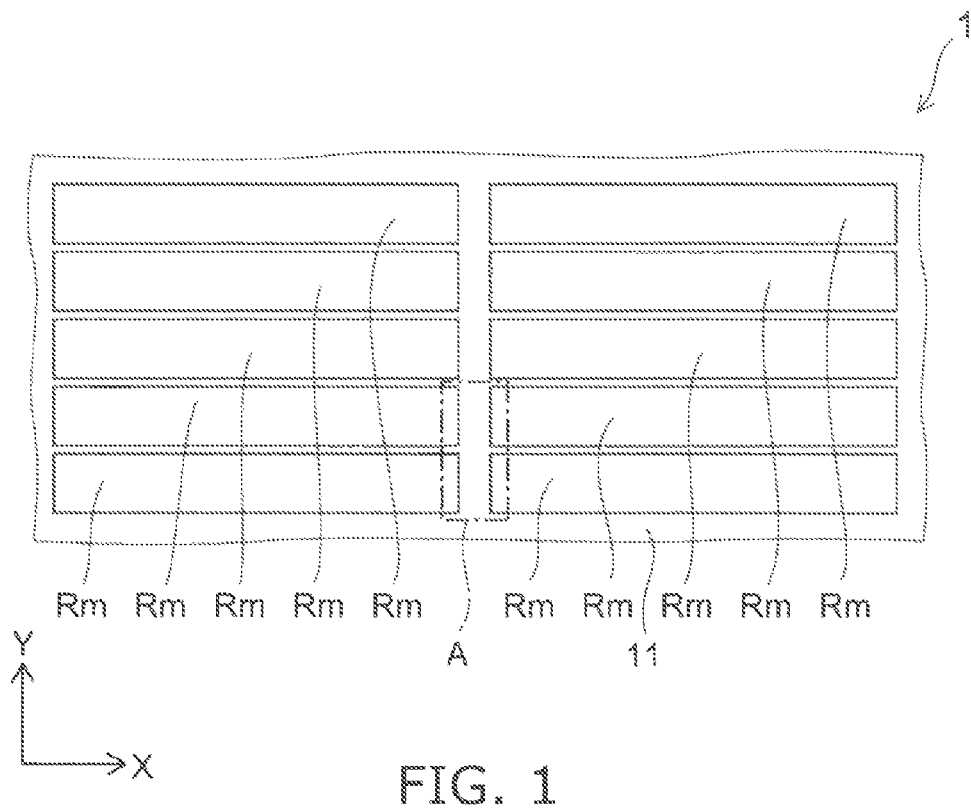
FIG. 1 is a plan view illustrating a semiconductor memory device according to an embodiment.

FIG. 1 is a plan view illustrating a semiconductor memory device according to this embodiment.

Figure 2:
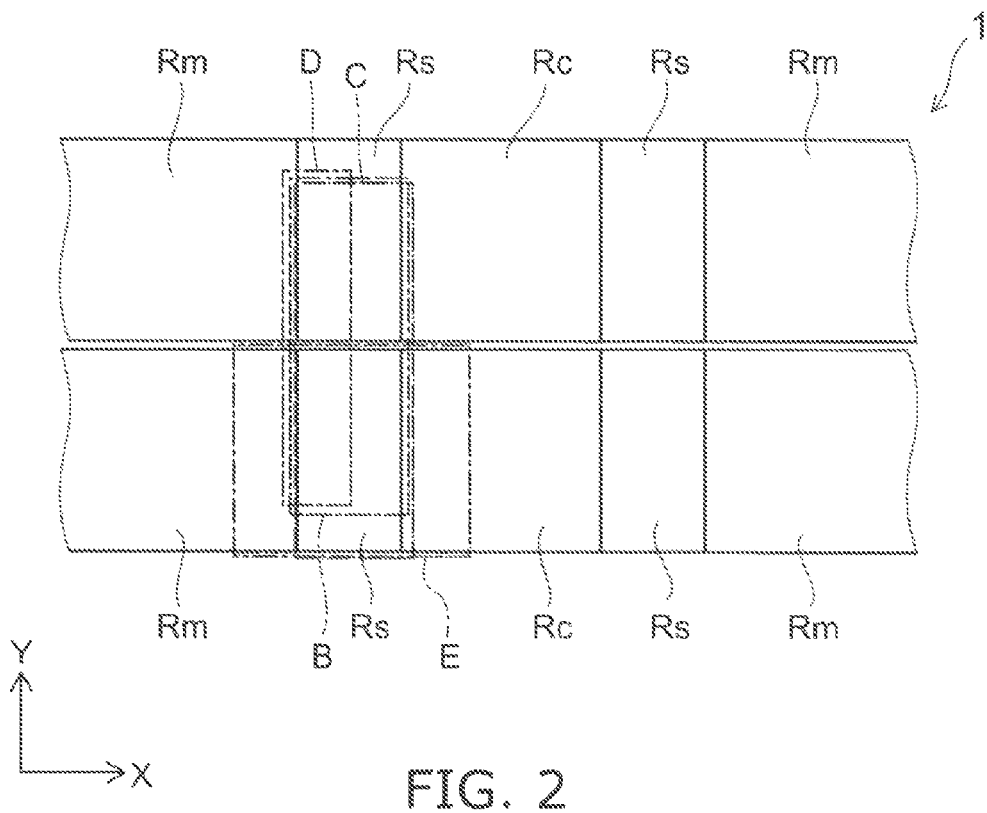
FIG. 2 is a plan view illustrating the semiconductor memory device according to this embodiment, enlarging region A shown in FIG. 1.

FIG. 2 is a plan view illustrating the semiconductor memory device according to this embodiment, enlarging region A shown in FIG. 1.

Figure 3:
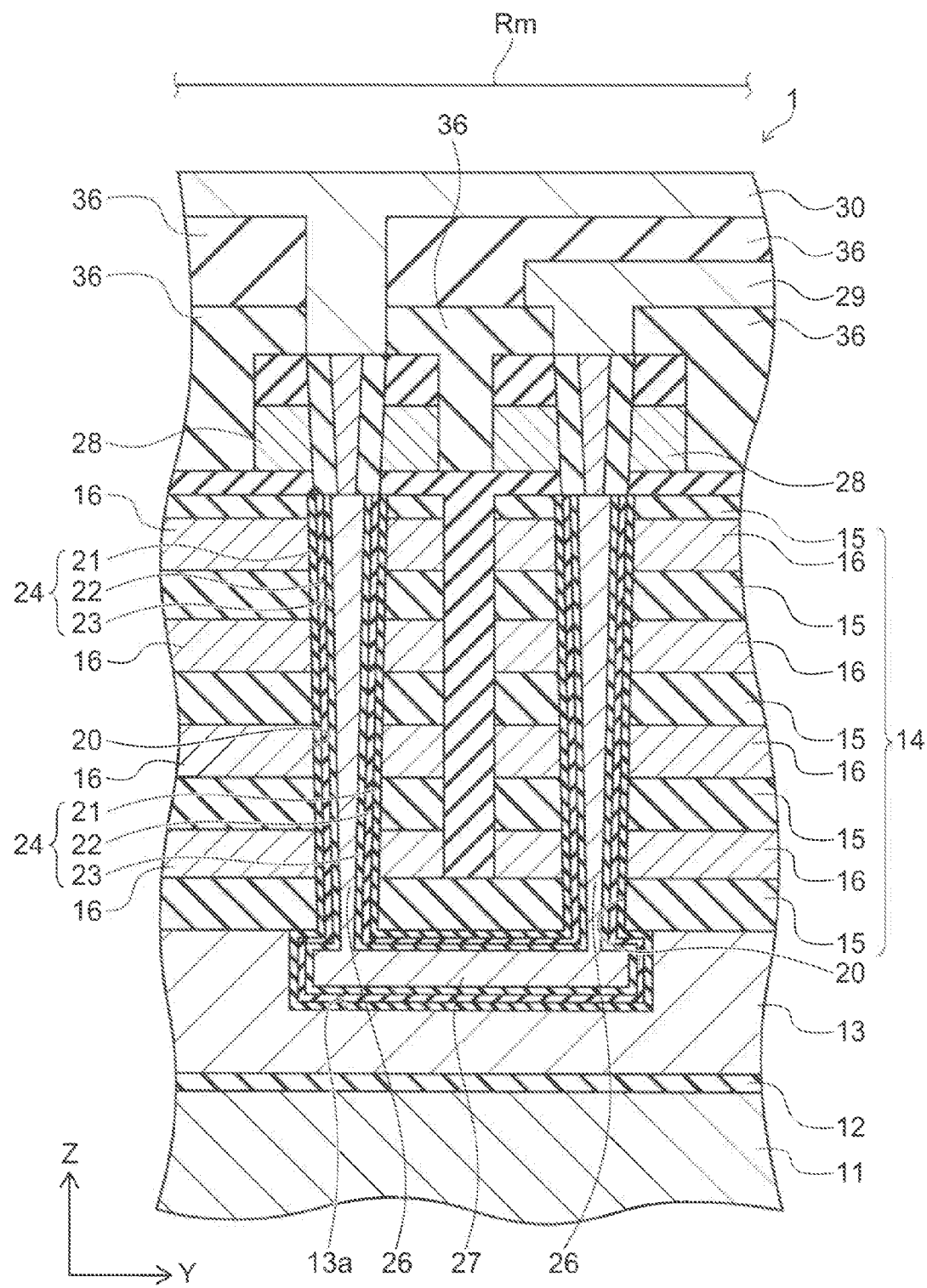
FIG. 3 is a sectional view illustrating a memory region of the semiconductor memory device according to this embodiment.

FIG. 3 is a sectional view illustrating a memory region of the semiconductor memory device according to this embodiment.

Figure 4:
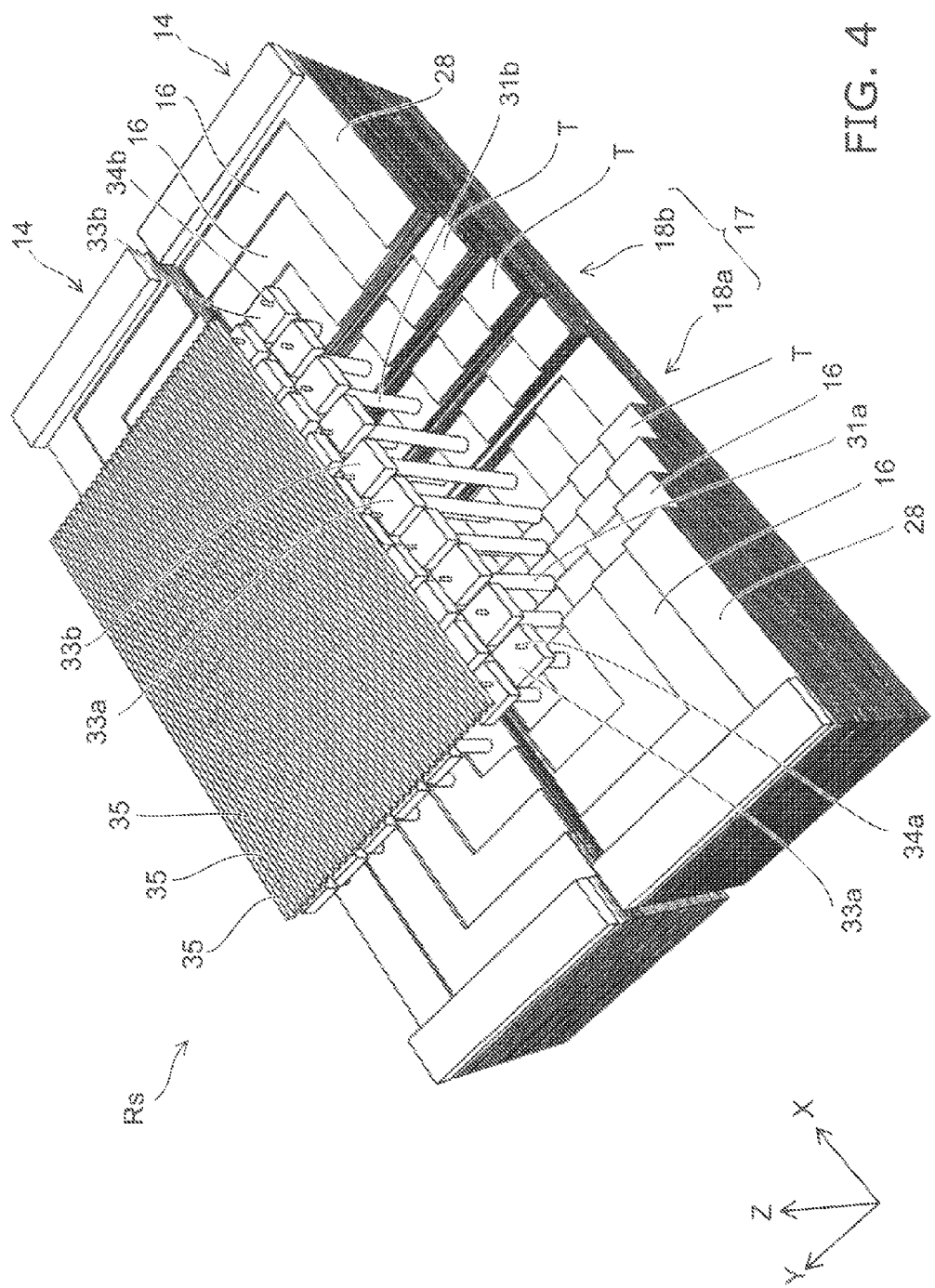
FIG. 4 is a perspective view illustrating the semiconductor memory device according to this embodiment, showing region B shown in FIG. 2.

FIG. 4 is a perspective view illustrating the semiconductor memory device according to this embodiment, showing region B shown in FIG. 2.

Figure 5:
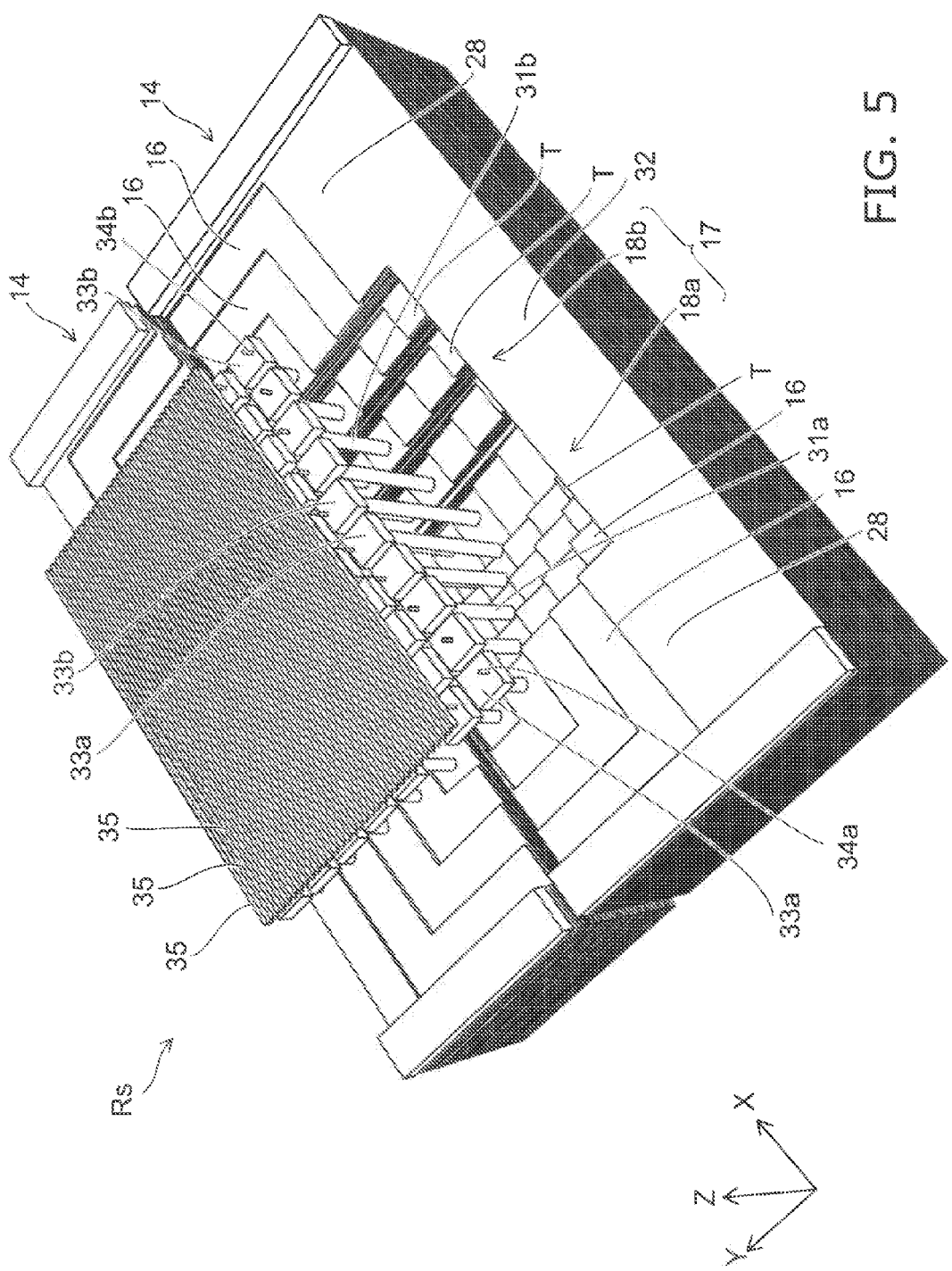
FIG. 5 is a perspective view illustrating the semiconductor memory device according to this embodiment, showing region C shown in FIG. 2.

FIG. 5 is a perspective view illustrating the semiconductor memory device according to this embodiment, showing region C shown in FIG. 2.

Figure 6:
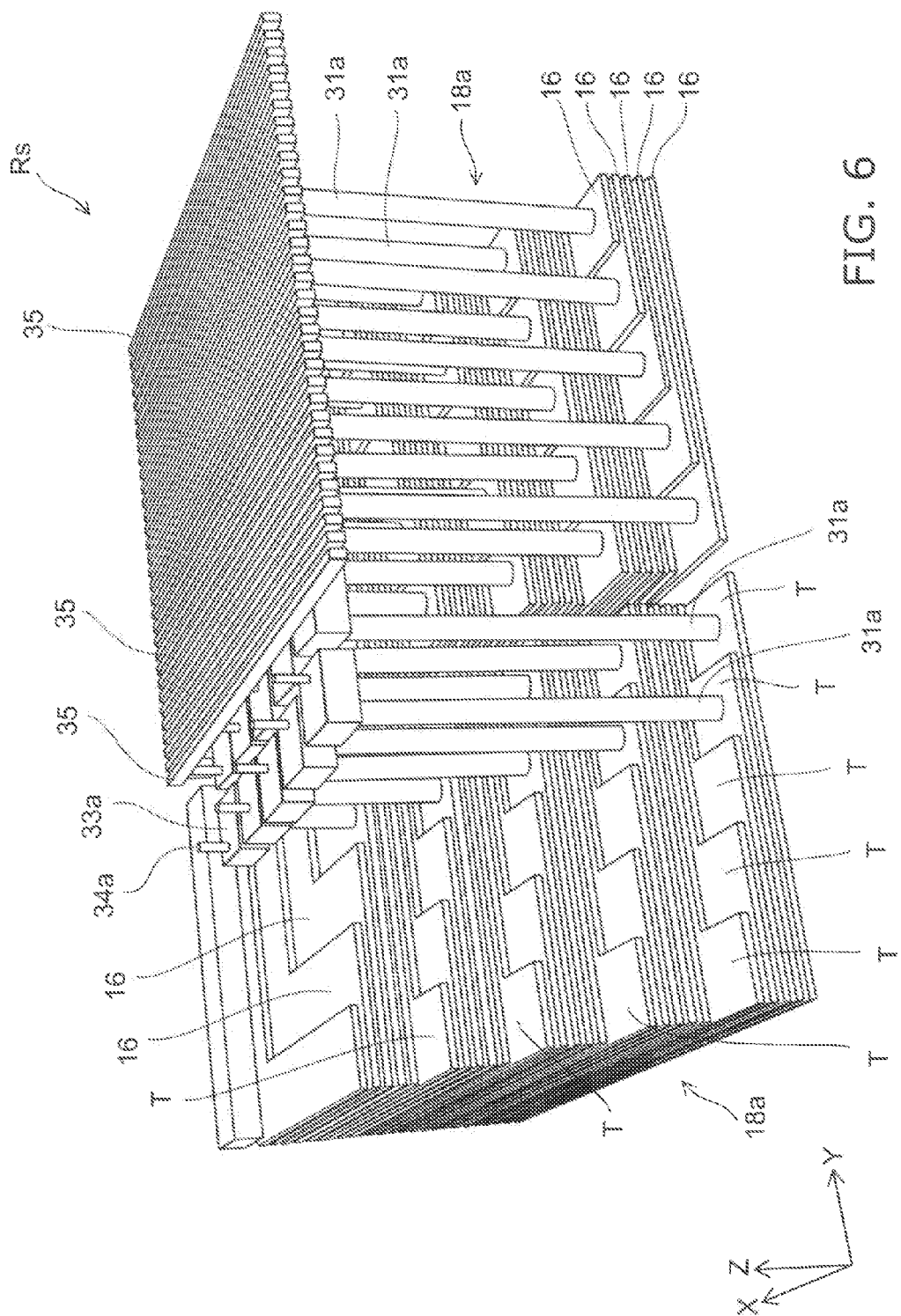
FIG. 6 is a perspective view illustrating the semiconductor memory device according to this embodiment, showing region D shown in FIG. 2.

FIG. 6 is a perspective view illustrating the semiconductor memory device according to this embodiment, showing region D shown in FIG. 2.

Figure 7:
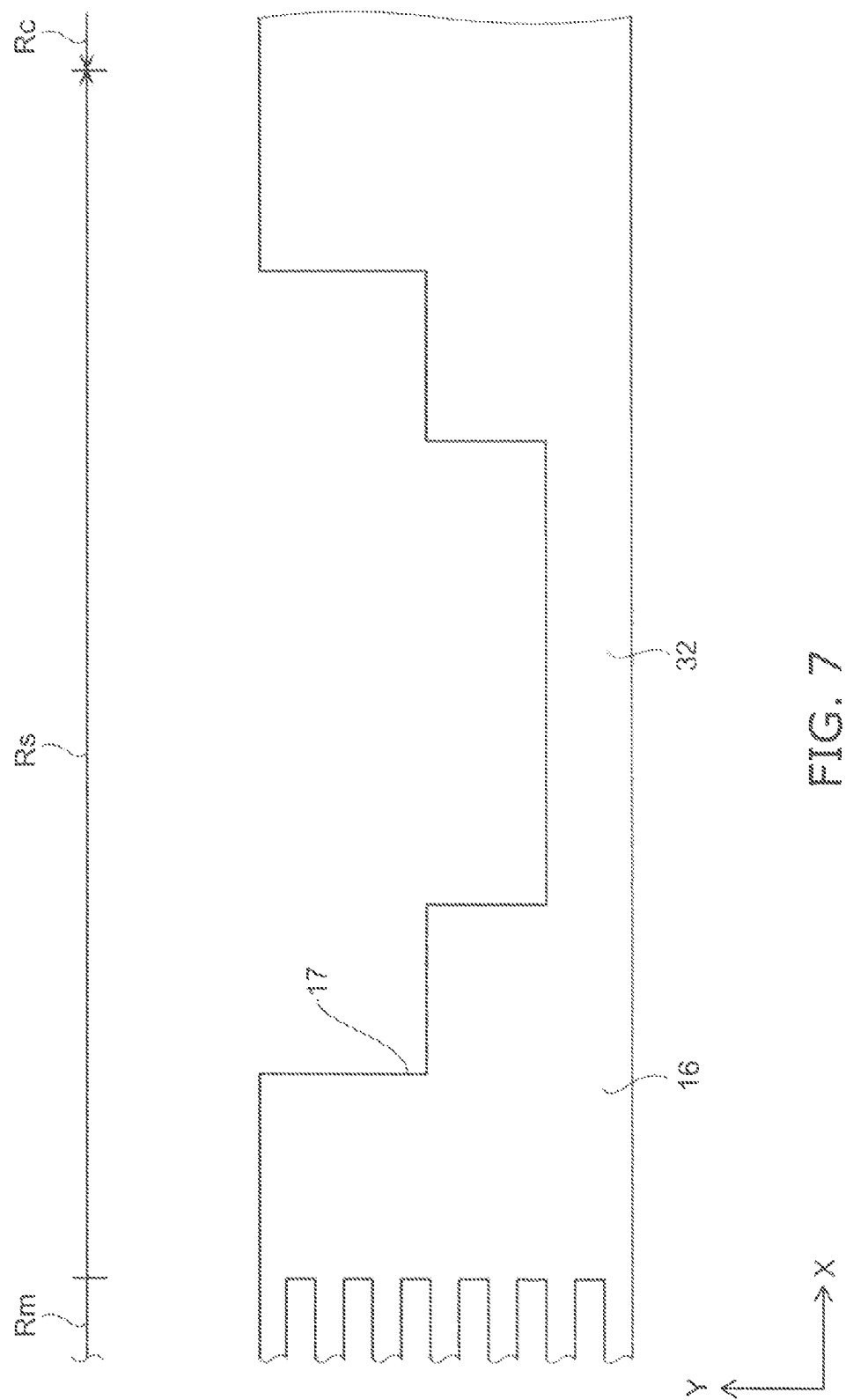
FIG. 7 is a plan view illustrating an electrode film in this embodiment, showing region E shown in FIG. 2.

FIG. 7 is a plan view illustrating an electrode film in this embodiment, showing region E shown in FIG. 2.

For convenience of illustration, each figure shows the components selectively. That is, FIG. 1 shows only the outer edge of the semiconductor substrate and the memory region. FIG. 2 shows only the outer edge of the memory region, the staircase region, and the peripheral circuit region. FIG. 3 shows only the memory region. FIGS. 4, 5, and 6 show only the conductive portions. FIG. 7 shows only one electrode film. FIGS. 4 and 5 are perspective views of nearly the same portion of the multilayer body 14 as viewed in the same direction. However, in FIG. 4, the bridge portion 32 (see FIG. 5) is omitted to show the configuration of the terrace. This also applies to FIG. 6. On the other hand, FIG. 5 shows the bridge portion 32. Furthermore, FIG. 7 is a plan view of only the uppermost electrode film 16 as viewed from immediately thereabove (in the Z direction), the uppermost electrode film 16 being singled out of the multilayer body 14 shown in FIGS. 4 to 6.

As shown in FIG. 1, the semiconductor memory device (hereinafter also simply referred to as "device") 1 according to this embodiment includes a silicon substrate 11 illustratively made of single crystal silicon. In the following, for convenience of description, an XYZ orthogonal coordinate system is herein introduced. In this coordinate system, the two directions parallel to the upper surface of the silicon substrate 11 and orthogonal to each other are referred to as X and Y direction, and the direction orthogonal to both the X and Y direction, or the vertical direction, is referred to as Z direction.

In the device 1, a plurality of memory regions Rm including memory cells for storing data are established. As viewed in the Z direction, each memory region Rm is shaped like a strip. Its longitudinal direction is aligned with the X direction, and its width direction is aligned with the Y direction. The plurality of memory regions Rm are arranged in a matrix along the X and Y direction.

As shown in FIG. 2, a peripheral circuit region Rc is established between two memory regions Rm adjacent in the X direction. Furthermore, a staircase region Rs is established between the memory region Rm and the peripheral circuit region Rc. The peripheral circuit region Rc is a region populated with e.g. transfer gates for driving memory cells in the two adjacent memory regions Rm. The staircase region Rs is a region for allowing the electrode film extracted from the memory region Rm to be connected to contacts.

As shown in FIG. 3, on the silicon substrate 11, an insulating layer 12, a back gate electrode 13, and a multilayer body 14 are provided. The multilayer body 14 is configured so that a plurality of insulating films 15 and electrode films 16 are alternately stacked therein. The multilayer body 14 is provided in the memory region Rm, the staircase region Rs, and the peripheral circuit region Rc. However, in the staircase region Rs, a valley 17 (see FIG. 4) is formed. The shape of the valley 17 is described later.

In the portion of the multilayer body 14 provided in the memory region Rm, a plurality of through holes 20 are formed. The through hole 20 extends in the stacking direction (Z direction) of the insulating films 15 and electrode films 16, and penetrates through the multilayer body 14. As viewed in the Z direction, the through holes 20 are arranged in a matrix along the X and Y direction. Two through holes 20 adjacent in the Y direction are in communication with each other by a recess 13a formed in the upper surface of the back gate electrode 13.

A block insulating layer 21 is provided on the inner surface of the through hole 20 and the recess 13a. The block insulating layer 21 is a layer which passes no substantial current even if a voltage is applied within the driving voltage range of the device 1. The block insulating layer 21 is formed from e.g. silicon oxide. A charge storage layer 22 is provided on the block insulating layer 21. The charge storage layer 22 is a layer capable of storing charge. The charge storage layer 22 is illustratively a layer containing electron trap sites, and is formed from e.g. silicon nitride. A tunnel insulating layer 23 is provided on the charge storage layer 22. The tunnel insulating layer 23 is a layer which is normally insulative, but passes a tunneling current when a prescribed voltage within the driving voltage range of the device 1 is applied. The tunnel insulating layer 23 is formed from e.g. silicon oxide. The block insulating layer 21, the charge storage layer 22, and the tunnel insulating layer 23 are stacked to form a memory film 24.

Polysilicon is buried inside the through hole 20 and the recess 13a. A silicon pillar 26 (semiconductor member) is formed from the polysilicon buried in the through hole 20. The silicon pillar 26 is shaped like a column, such as a cylinder, extending in the Z direction. On the other hand, a connecting member 27 is formed from the polysilicon buried in the recess 13a. Two silicon pillars 26 adjacent in the Y direction are connected to each other by the connecting member 27.

A select gate electrode 28 extending in the X direction is provided on the multilayer body 14. A source line 29 extending in the X direction is provided on the select gate electrode 28. A bit line 30 extending in the Y direction is provided on the source line 29. One of the two silicon pillars 26 connected to each other by the connecting member 27 penetrates through the select gate electrode 28 and is connected to the source line 29. The other penetrates through the select gate electrode 28 and is connected to the bit line 30. By such a configuration, the charge storage layer 22 is placed between the electrode film 16 and the silicon pillar 26, and a memory cell is configured for each intersection of the electrode film 16 and the silicon pillar 26. Consequently, in the memory region Rm, a plurality of memory cells are arranged in a three-dimensional matrix in the multilayer body 14.

In the peripheral circuit region Rc, a driver circuit (not shown) for driving the memory cells is formed on the silicon substrate 11. On the silicon substrate 11, a gate electrode (not shown) of the transistor constituting this driver circuit is provided. The multilayer body 14 is provided on the gate electrode. However, in the peripheral circuit region Rc, the silicon pillar 26 and the memory film 24 are not provided in the multilayer body 14. In the peripheral circuit region Rc, contacts (not shown) for allowing interconnections 35 (see FIGS. 4 to 6) provided on the multilayer body 14 to be connected to various portions of the driving circuit are provided through the multilayer body 14. In the peripheral circuit region Rc, the multilayer body 14 may be replaced by an interlayer insulating film having a thickness comparable to that of the multilayer body 14.

As shown in FIGS. 4 to 7, in the staircase region Rs, a valley 17 is formed in the multilayer body 14. The valley 17 is composed of a pair of staircases 18a and 18b opposed to each other in the X direction. The staircase 18a is a slope on the memory region Rm side of the valley 17. The staircase 18b is a slope on the peripheral circuit region Rc side of the valley 17. The shape of the staircase 18a is a generally mirror image of the shape of the staircase 18b with respect to the YZ plane. That is, the shape of the staircase 18a and the shape of the staircase 18b are generally plane symmetric with respect to the YZ plane. Furthermore, the multilayer body 14 is provided for each region including the memory region Rm, the staircase region Rs, and the peripheral circuit region Rc arranged along the X direction. Two multilayer bodies 14 adjacent in the Y direction are paired. In the paired multilayer bodies 14, the valleys 17 are in communication with each other, the shapes of the staircases 18a are generally mirror images of each other with respect to the XZ plane, and the shapes of the staircases 18b are also generally mirror images of each other with respect to the XZ plane.

In the staircase 18a, a terrace T is formed for each electrode film 16 and select gate electrode 28. That is, the number of terraces T is equal to the total number of stacked layers of the electrode films 16 and the select gate electrode 28. As viewed in the Z direction, the terraces T are arranged in a grid. For instance, in the example shown in FIGS. 4 to 6, the number of stacked layers of the electrode films 16 is 24, and the number of stacked layers of the select gate electrode 28 is 1. Thus, 25 terraces T are arranged in a 5 by 5 grid. In the staircase 18a, the terrace T nearer to the staircase 18b has a lower height, and the terrace T farther from the staircase 18b has a higher height. The step difference between the terraces T in the X direction corresponds to five electrode films 16. That is, with a shift from a terrace T by the amount of one terrace away from the staircase 18b, the number of stacked layers of the electrode films 16 increases by five. Furthermore, the step difference between the terraces T in the Y direction corresponds to one electrode film 16. That is, in the staircase 18a, with a shift by the amount of one terrace in the Y direction, the number of stacked layers of the electrode films 16 increases or decreases by one. The foregoing also applies to the shape of the staircase 18b.

In the staircase 18a, one contact 31a is provided immediately above each terrace T. Similarly, in the staircase 18b, one contact 31b is provided immediately above each terrace T. That is, in the example shown in FIGS. 4 to 6, 25 contacts 31a are provided immediately above the staircase 18a, and 25 contacts 31b are provided immediately above the staircase 18b. As viewed in the Z direction, the contacts 31a and 31b are arranged in a matrix. Each of the contacts 31a and 31b is connected to the electrode film 16 stacked in the uppermost layer in the terrace T located immediately therebelow. Here, FIGS. 4 to 6 show only a subset of the contacts.

As shown in FIGS. 5 and 7, the valley 17 is not formed in one end portion in the Y direction of the staircase region Rs, but a bridge portion 32 is formed in which the electrode film 16 entirely remains. That is, as viewed in the Z direction, each electrode film 16 has a U-shape circumventing the valley 17. Thus, in each electrode film 16, the portion with the contact 31a connected thereto and the portion with the contact 31b connected thereto are integrally formed, and connected to each other through the bridge portion 32. Here, as described above, for clarity of illustration, the bridge 32 is not shown in FIGS. 4 and 6.

As shown in FIGS. 4 to 6, a conductive film 33a is provided immediately above each contact 31a and connected to the upper end of the contact 31a. A via 34a is provided immediately above each conductive film 33a, and the lower end of the via 34a is connected to the conductive film 33a. That is, the via 34a is connected to the contact 31a through the conductive film 33a. Similarly, a conductive film 33b is provided immediately above each contact 31b and connected to the upper end of the contact 31b. A via 34b is provided immediately above each conductive film 33b, and the lower end of the via 34b is connected to the conductive film 33b. That is, the via 34b is connected to the contact 31b through the conductive film 33b.

As viewed in the Z direction, the conductive films 33a and 33b are larger than the contacts 31a and 31b, and slightly smaller than each terrace T. Each of the conductive films 33a and 33b is located generally immediately above the corresponding terrace T. The diameter of the vias 34a and 34b is smaller than the diameter of the contacts 31a and 31b. The positions of the vias 34a in the Y direction are slightly different from each other. The positions of the vias 34b in the Y direction are also slightly different from each other. However, the position in the Y direction of the via 34a connected to one electrode film 16 through the contact 31a is nearly the same as the position in the Y direction of the via 34b connected to the same electrode film 16 through the contact 31b.

The interconnection 35 extending in the X direction is provided above the vias 34a and 34b. The width, or the length in the Y direction, of the interconnection 35 is smaller than the length in the Y direction of the conductive films 33a and 33b. Immediately above each sequence of the conductive films 33a and 33b arranged along the X direction, five interconnections 35 are provided. The number of interconnections 35 is equal to the number of contacts 31a, and hence equal to the total number of stacked layers of the electrode films 16 and the select gate electrode 28, the number being e.g. 25. Furthermore, the upper ends of one via 34a and one via 34b are connected to each interconnection 35. Here, the vias 34a and 34b connected to the same electrode film 16 are connected to the same interconnection 35.

In other words, one interconnection 35 is connected to the portion of one electrode film 16 constituting the terrace T of the staircase 18a through the via 34a, the conductive film 33a, and the contact 31a, and connected to the portion of the same electrode film 16 constituting the terrace T of the staircase 18b through the via 34b, the conductive film 33b, and the contact 31b. That is, each interconnection 35 is connected to the corresponding electrode film 16 through two contacts 31a and 31b. This enables the voltage generated in the driver circuit formed in the peripheral circuit region Rc to be applied to the electrode film 16 through the interconnection 35.

Furthermore, an interlayer insulating film 36 (see FIG. 3) is provided so as to cover the multilayer body 14. The aforementioned select gate electrode 28, source line 29, bit line 30, contacts 31a and 31b, conductive films 33a and 33b, vias 34a and 34b, and interconnection 35 are buried in the interlayer insulating film 36.

Next, a method for manufacturing the semiconductor memory device 1 according to this embodiment is described.

Figure 8:
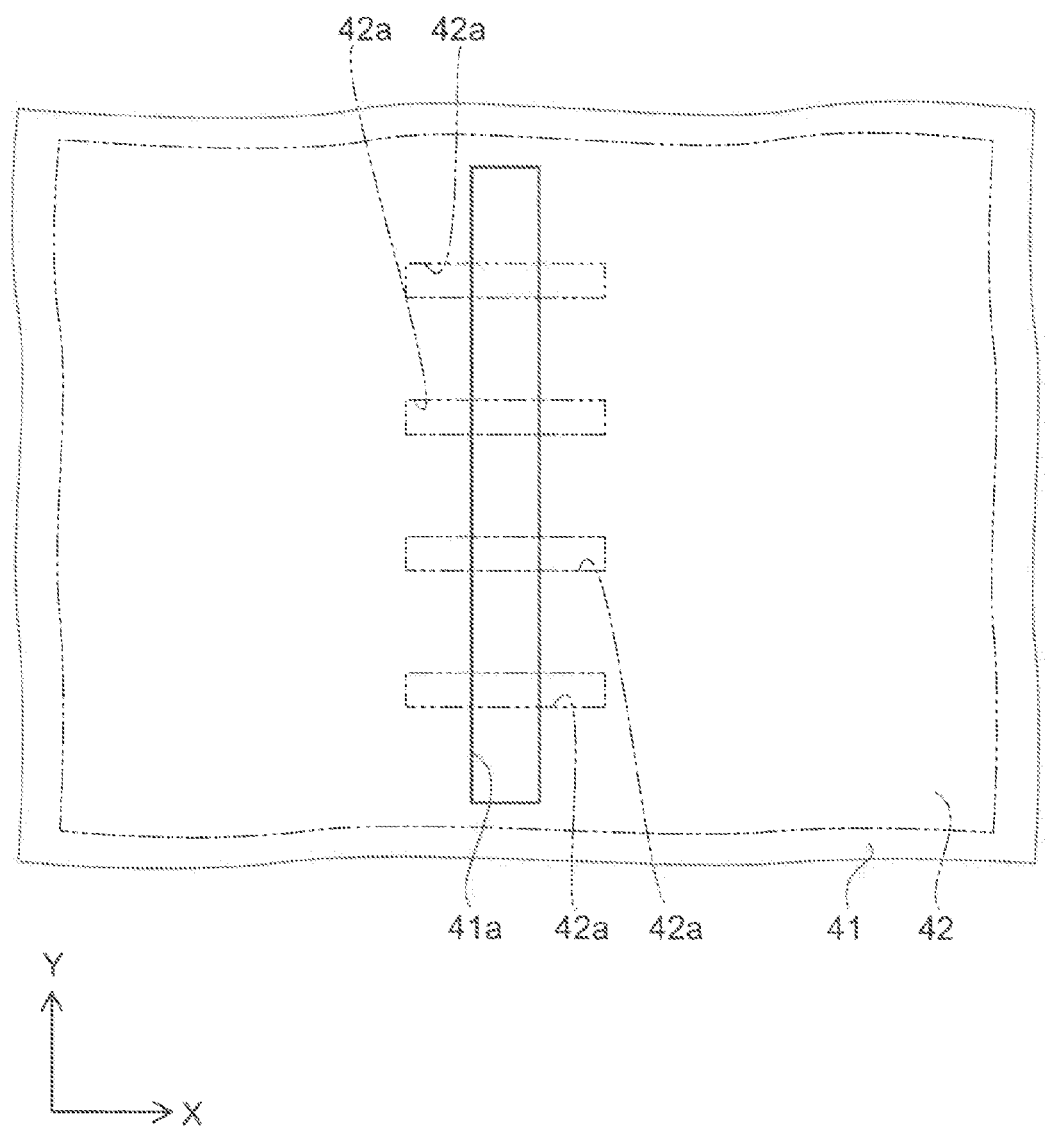
FIG. 8 is a plan view illustrating a resist film used in a method for manufacturing the semiconductor memory device according to this embodiment.

FIG. 8 is a plan view illustrating a resist film used in the method for manufacturing a semiconductor memory device according to this embodiment.

In FIG. 8, two resist films used at different timings are superimposed. The resist film 41 used earlier is depicted by the solid line, and the resist film 42 used later is depicted by the double dot-dashed line.

As shown in FIG. 3, an insulating layer 12 is formed on a silicon substrate 11. A conductive film is formed thereon and patterned. Thus, in this conductive film, the portion formed in the memory region Rm and the staircase region Rs constitutes a back gate electrode 13, and the portion formed in the peripheral circuit region Rc constitutes a gate electrode (not shown) of the transistor constituting the driver circuit. Next, a recess 13a is formed in the upper surface of the portion of the back gate electrode 13 located in the memory region Rm. A sacrificial material (not shown) is buried inside the recess 13a.

Next, insulating films 15 and electrode films 16 are alternately stacked to form a multilayer body 14. Next, a hard mask illustratively made of BSG (boron silicate glass, or boron-doped silicon oxide) is used as a mask to etch the portion of the multilayer body 14 located in the memory region Rm. Thus, through holes 20 extending in the Z direction are formed and caused to reach both end portions of the recess 13a. Next, the sacrificial material in the recess 13a is removed. A block insulating layer 21, a charge storage layer 22, and a tunnel insulating layer 23 are formed in this order on the inner surface of the through hole 20 and the recess 13a. Next, polysilicon is buried inside the recess 13a and the through hole 20 to form a connecting member 27 and a silicon pillar 26. Next, a select gate electrode 28 is formed on the multilayer body 14.

Next, as shown in FIGS. 4 and 8, a resist material is applied onto the select gate electrode 28 and dried to form a resist film 41. Next, by photolithography, an opening 41a extending in the Y direction is formed in the resist film 41. Then, etching using the resist film 41 as a mask, and slimming of the resist film 41 are alternately performed. Specifically, first, the resist film 41 is used as a mask to perform RIE (reactive ion etching). Thus, immediately below the opening 41a, a plurality of layers, such as five layers, each for the electrode film 16 and the insulating film 15, are removed from the multilayer body 14. Next, for instance, isotropic etching with oxygen plasma is performed to slim the resist film 41. Thus, the opening 41a is expanded in the X and Y direction, and the edge of the opening 41a is set back by the amount of one terrace in the X direction. Next, the slimmed resist film 41 is used as a mask to perform RIE for five layers. Such a process of etching and slimming is repeated a plurality of times. For instance, etching is performed four times. Thus, four step differences, each by the amount of five layers, are formed along the X direction in the multilayer body 14. Subsequently, the resist film 41 is removed.

Next, a resist film 42 is formed on the multilayer body 14. By photolithography, an opening 42a extending in the X direction is formed. Then, etching using the resist film 42 as a mask, and slimming of the resist film 42 are alternately performed. Specifically, first, the resist film 42 is used as a mask to perform RIE. Thus, immediately below the opening 42a, one layer, each for the electrode film 16 and the insulating film 15, is removed from the multilayer body 14. Next, for instance, isotropic etching with oxygen plasma is performed to slim the resist film 42. Thus, the opening 42a is expanded in the X and Y direction, and the edge of the opening 42a is set back by the amount of one terrace in the Y direction. Next, the slimmed resist film 42 is used as a mask to perform RIE for one layer. Such a process of etching and slimming is repeated a plurality of times. For instance, etching is performed four times. Thus, four step differences, each by the amount of one layer, are formed along the Y direction in the multilayer body 14. Subsequently, the resist film 42 is removed.

Consequently, the staircase 18a and the staircase 18b are simultaneously formed in the multilayer body 14, and a valley 17 is formed. The shape of the staircases 18a and 18b is generally plane symmetric with respect to the YZ plane. However, shape variation due to local variation of RIE may occur. In each of the staircases 18a and 18b, terraces T are formed in a 5 by 5 grid. Here, wide spacings are taken in the Y direction between the openings 41a and between the openings 42a to provide a region not etched to the last. Thus, part of each electrode film 16 is left to form a bridge portion 32 (see FIG. 5) extending in the X direction.

Next, as shown in FIG. 3, the electrode films 16 and the select gate electrode 28 are divided along the Y direction. Furthermore, the memory region Rm, the staircase region Rs, and the peripheral circuit region Rc arranged along the X direction are treated as one unit to divide the multilayer body 14.

Next, as shown in FIG. 4, an interlayer insulating film is formed so as to bury the multilayer body 14. Contacts 31a and 31b are formed in this interlayer insulating film. The contact 31a is formed immediately above each terrace T of the staircase 18a and connected to the uppermost electrode film 16 left in this terrace T. The contact 31b is formed immediately above each terrace T of the staircase 18b and connected to the uppermost electrode film 16 left in this terrace T. Thus, one contact 31a and one contact 31b are connected to each electrode film 16. That is, a total of two contacts are connected to each electrode film 16. Here, also in the peripheral circuit region Rc, contacts (not shown) connected to various portions of the driver circuit are formed.

Next, source lines 29 are formed in the memory region Rm, and conductive films 33a and 33b are formed in the staircase region Rs. The conductive film 33a is formed for each contact 31a, and the conductive film 33b is formed for each contact 31b. Next, in the staircase region Rs, vias 34a and 34b are formed. The via 34a is formed for each conductive film 33a, and the via 34b is formed for each conductive film 33b. However, as described above, the positions in the Y direction of the vias 34a connected to the respective conductive films 33a arranged in the X direction are made slightly different from each other. This also applies to the vias 34b. Furthermore, the positions in the Y direction of the via 34a and the via 34b connected to the same electrode film 16 are made generally identical to each other.

Next, bit lines 30 are formed in the memory region Rm, and interconnections 35 are formed in the staircase region Rs. Each interconnection 35 is commonly connected to the two vias 34a and 34b connected to the corresponding electrode film 16, and connected also to the contact (not shown) formed in the peripheral circuit region Rc. Thus, the semiconductor memory device 1 according to this embodiment is manufactured.

Next, the effect of this embodiment is described.

In this embodiment, when the staircases 18a and 18b are formed, two resist films 41 and 42 are used to perform etching and slimming to form terraces T in a grid. Thus, as compared with the case of forming a simple staircase along one direction, the number of terraces T can be increased. That is, when the resist film is slimmed, the edge of the resist film is not only set back horizontally, but also the film thickness is reduced. Hence, the initial film thickness of the resist film needs to be set equal to or more than the value obtained by adding the amount of variation in the stairs to the total amount of horizontally setting back the edge of the resist film. However, because the film thickness of the resist film has an upper limit, the number of stairs is restricted by this upper limit of the film thickness. For instance, suppose that slimming can be performed no more than three times due to the restriction of the initial film thickness of the resist film. Then, etching can be performed no more than four times, and the staircase can be formed with no more than five stairs. Hence, in the case of forming a simple staircase along one direction, no more than five terraces can be formed. Even if two resist films are used, no more than ten terraces can be formed.

In contrast, according to this embodiment, two resist films are used to form a staircase in different directions. Hence, 5×5=25 terraces can be formed even if the number of stairs that can be formed by one resist film is five. Thus, the number of electrode films 16 stacked in the multilayer body 14 can be increased, and the integration density of memory cells can be increased. Furthermore, by arranging the terraces in a grid, the area of the staircase region Rs can be reduced. This also serves to downsize the device 1 and increase the integration density of memory cells.

However, if such a grid-like staircase is formed, the area of each terrace is made small, and no more than one contact can be connected to each terrace. On the other hand, in operations for programming and erasing memory cells, the electrode film 16 needs to be applied with a high voltage. Repeated application of such a high voltage may cause open defects in the contact. Suppose that only one contact is connected between the interconnection 35 and the electrode film 16. If this contact is turned open, this electrode film 16 cannot be applied with voltage, which makes many memory cells inoperable. Here, it may be contemplated to increase the area of each terrace in the grid-like staircase so that a plurality of contacts are connected to each terrace. However, this requires a larger initial film thickness for the resist film, hence decreasing the number of stairs that can be formed.

Thus, in this embodiment, opposite to the staircase 18a on the memory region Rm side, another staircase 18b is formed also on the peripheral circuit region Rc side. A contact 31a is provided for each terrace T of the staircase 18a, and a contact 31b is provided for each terrace T of the staircase 18b. Thus, one interconnection 35 is connected to one electrode film 16 through two contacts 31a and 31b. Hence, even if one contact is turned open, the remaining one contact enables the electrode film 16 to be applied with voltage. Thus, the semiconductor memory device 1 according to this embodiment has high reliability. Here, the electrode film 16 only needs to be applied with voltage, and no substantial current needs to be passed therethrough. Hence, there is no problem even if the two contacts are reduced to one contact.

Furthermore, in this embodiment, the shapes of the staircases 18a and 18b are made plane symmetric to each other. Thus, the staircases 18a and 18b can be simultaneously formed by using a pair of resist films 41 and 42. Hence, formation of the staircase 18b does not increase the number of process steps. Accordingly, the manufacturing cost does not increase, either.

Furthermore, in this embodiment, conductive films 33a and 33b are provided above the contacts 31a and 31b. Vias 34a and 34b are provided above the conductive films 33a and 33b. The positions of the vias 34a in the Y direction are made different from each other, and the positions of the vias 34b in the Y direction are made different from each other. Furthermore, the positions in the Y direction of the vias 34a and 34b connected to the same electrode film 16 are made identical to each other. Thus, two vias 34a and 34b can be commonly connected to each interconnection 35. Furthermore, the diameter of the vias 34a and 34b is made smaller than the diameter of the contacts 31a and 31b. Thus, the arrangement pitch of the interconnections 35 can be reduced. This also serves to downsize the semiconductor memory device 1.

Next, a variation of this embodiment is described.

Figure 9:
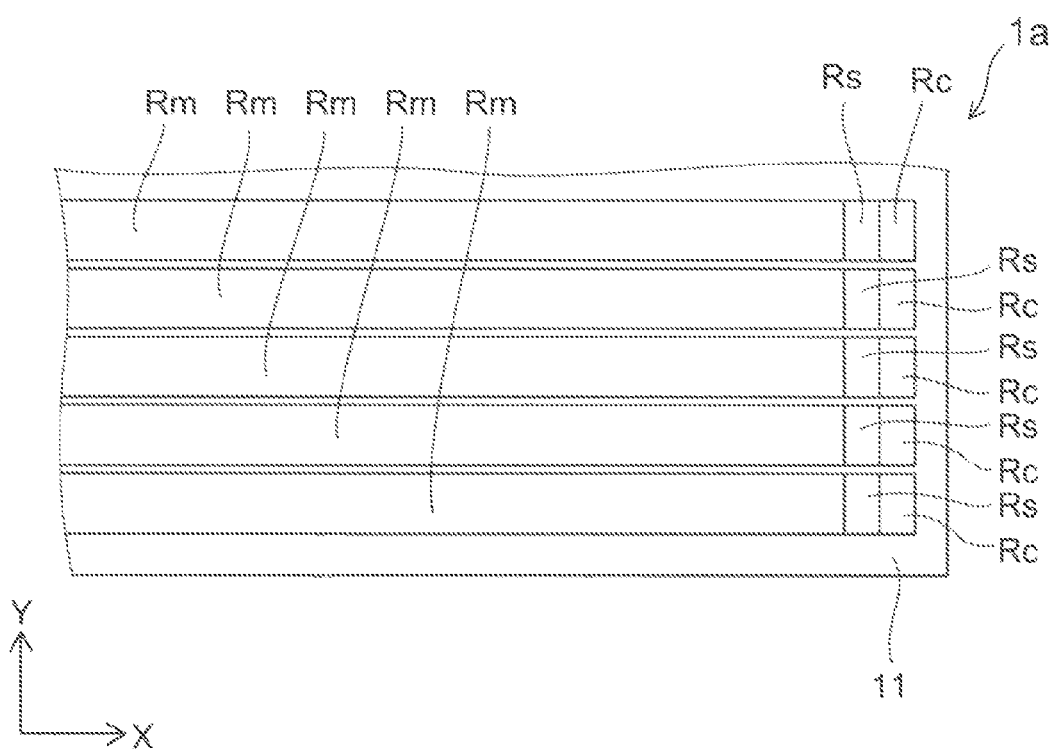
FIG. 9 is a plan view illustrating a semiconductor memory device according to a variation of this embodiment.

FIG. 9 is a plan view illustrating a semiconductor memory device according to this variation.

As shown in FIGS. 1 and 2, in the example of the embodiment described above, a pair of memory regions Rm are established on both sides of the peripheral circuit region Rc in the X direction. In contrast, as shown in FIG. 9, in the semiconductor memory device 1a according to this variation, a memory region Rm is established on only one side of the peripheral circuit region Rc. Furthermore, as in the above embodiment, a staircase region Rs is established between the peripheral circuit region Rc and the memory region Rm. In the staircase region Rs, a valley V is formed in the multilayer body 14. The configuration, manufacturing method, and effect of this variation other than the foregoing are similar to those of the above embodiment.

While certain embodiment has been described, this embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the invention.

For instance, in the example of the embodiment described above, the electrode film 16 has a U-shape. In the electrode film 16, the portion with the contact 31a connected thereto and the portion with the contact 31b connected thereto are integrally formed, and connected to each other through the bridge portion 32. However, the invention is not limited thereto. For instance, in the electrode film 16, the portion with the contact 31a connected thereto and the portion with the contact 31b connected thereto may be separated from each other, and are connected to each other by a interconnection other than the interconnection 35. Furthermore, in the example of the embodiment described above, the terraces T are arranged in a grid in the staircases 18a and 18b. However, the invention is not limited thereto.

The embodiment described above can realize a semiconductor memory device with high reliability.

What is claimed is:

1. A semiconductor memory device comprising:
a substrate;
a multilayer body provided on the substrate, with a plurality of insulating films and electrode films alternately stacked, including a valley made of a pair of staircases opposed to each other and including a terrace for each of the electrode films, and being not full divided by the valley;
a first contact connected to a portion of the each of the electrode films constituting the terrace of one of the staircases;
a second contact connected to a portion of the each of the electrode films constituting the terrace of another of the staircases;
an interconnection connected to the first contact and the second contact;
a semiconductor member provided in a portion of the multilayer body on a side of the first contact as viewed from the valley, the semiconductor member extending in a stacking direction of the insulating films and the electrode films; and
a charge storage layer provided between the each of the electrode films and the semiconductor member.

2. The device according to claim 1, wherein the each of the electrode films includes a bridge portion connecting a portion with the first contact connected to the each of the electrode films to a portion with the second contact connected to the each of the electrode films.

3. The device according to claim 1, wherein as viewed in the stacking direction, the each of the electrode films has a U-shape circumventing the valley.

4. The device according to claim 1, wherein as viewed in the stacking direction, the first terrace and the second terrace are arranged in a grid.

5. The device according to claim 1, wherein a shape of the one of the staircases is a mirror image of a shape of the another of the staircases.

6. The device according to claim 1, further comprising:
another multilayer body provided on the substrate, with a plurality of other insulating films and other electrode films alternately stacked, including another valley made of a pair of other staircases opposed to each other and including a terrace for each of the other electrode films, and being not full divided by the another valley;
another first contact connected to a portion of the each of the other electrode films constituting the terrace of one of the other staircases;
another second contact connected to a portion of the each of the other electrode films constituting the terrace of another of the other staircases;
another interconnection connected to the another first contact and the another second contact;
another semiconductor member provided in a portion of the another multilayer body on a side of the another first contact as viewed from the another valley, the another semiconductor member extending in the stacking direction; and
another charge storage layer provided between the each of the other electrode films and the another semiconductor member,
the another valley being in communication with the valley,
a shape of the one of the other staircases being a mirror image of a shape of the another of the other staircases,
a shape of the one of the staircases being a mirror image of the a shape of the one of the other staircases, and
a shape of the another of the staircases being a mirror image of the shape of the another of the other staircases.

7. The device according to claim 1, further comprising:
a first conductive film connected to an upper end of the first contact;
a second conductive film connected to an upper end of the second contact;
first vias with a lower end of one of the first vias connected to the first conductive film and an upper end of one of the first vias connected to the interconnection; and second vias with a lower end of one of the second vias connected to the second conductive film and an upper end of one of the second vias connected to the interconnection, the first via having a smaller diameter than the first contact, and the second via having a smaller diameter than the second contact, and in a width direction of the interconnection, positions of the first vias are different from each other, positions of the second vias are different from each other, and the position of the first via connected to one of the electrode films is identical to the position of the second via connected to the one of the electrode films.

* * * * *